(12) United States Patent
Lee et al.

(10) Patent No.: US 7,510,968 B2
(45) Date of Patent: Mar. 31, 2009

(54) CAP FOR SEMICONDUCTOR DEVICE PACKAGE, AND MANUFACTURING METHOD THEREOF

(75) Inventors: Moon-chul Lee, Yongin-si (KR); Jong-oh Kwon, Suwon-si (KR); Kae-dong Back, Yongin-si (KR); Qian Wang, Yongin-si (KR); Jun-sik Hwang, Yongin-si (KR); Kyu-dong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 11/412,900

(22) Filed: Apr. 28, 2006

(65) Prior Publication Data

US 2006/0286798 A1    Dec. 21, 2006

(30) Foreign Application Priority Data

Jun. 20, 2005    (KR)    ............... 10-2005-0053216

(51) Int. Cl.
  *H01L 21/44*    (2006.01)

(52) U.S. Cl. .................................................. 438/667
(58) Field of Classification Search ............... 438/653, 438/672, 675, 671; 257/621, 774; 174/36, 174/262, 363
See application file for complete search history.

(56) References Cited

U.S. PATENT DOCUMENTS

| | | | |
|---|---|---|---|
| 5,464,928 A * | 11/1995 | Chang et al. ................. | 528/353 |
| 6,039,889 A * | 3/2000 | Zhang et al. .................. | 216/17 |
| 6,486,394 B1 * | 11/2002 | Schmidt et al. ............... | 174/36 |
| 7,284,323 B2 * | 10/2007 | Cheng .......................... | 29/853 |
| 2006/0083904 A1 * | 4/2006 | Chung et al. ................. | 428/209 |

* cited by examiner

*Primary Examiner*—Calvin Lee
(74) *Attorney, Agent, or Firm*—Sughrue Mion, PLLC

(57) ABSTRACT

A cap for a semiconductor device package, including a body formed at a predetermined thickness with a cavity. The cap further includes a first seed layer formed on an inner circumference of a first via hole formed at a predetermined depth from the cavity formation surface of the body, a second seed layer formed on an inner circumference of a second via hole formed at a predetermined depth from the opposite surface to the cavity formation surface of the body, and plating materials filled in the first via hole and the second via hole.

10 Claims, 6 Drawing Sheets

CAP FOR SEMICONDUCTOR DEVICE PACKAGE, AND MANUFACTURING METHOD THEREOF

CROSS-REFERENCE TO RELATED APPLICATIONS

This application claims priority from Korean Patent Application No. 2005-53216, filed on Jun. 20, 2005, the entire content of which is incorporated herein by reference.

BACKGROUND OF THE INVENTION

1. Field of the Invention

Apparatuses and methods consistent with the present invention relate to a cap for a semiconductor device package, and more particularly, to a cap which can form a cavity and plate a via hole having a seed layer, and a manufacturing method thereof.

2. Description of the Related Art

In general, a microstructure package such as an IC, a hybrid chip for communication and an RF MEMS needs a low cost, high yield and ultra small packaging process. Simplification of the packaging process and high reliability is also necessary. Especially, the microstructure package requires a packaging technology allowing the making of a few devices of a single chip, and a via hole filling technology having high stability and reliability.

FIGS. 1 to 3 are cross-sectional views illustrating various methods for plating a via hole of a substrate to manufacture a related art cap for a semiconductor device package.

Referring to FIG. 1, a via hole is formed on a substrate having a thickness below 200 μm, and a metal 2 is filled in the via hole. In a state where a seed layer 3 is formed on the inner circumference of the via hole, the metal 2 is filled to form a fine plating layer. However, the aforementioned structure and method cannot form a cavity such as required in packaging.

As illustrated in FIG. 2, a via hole is formed or a substrate 11 having a thickness below 100 μm at a predetermined depth not to pass through the substrate 11, a seed layer 13 is formed in the via hole, and a metal 12 is filled to form a fine plating layer. As indicated by the dotted line, a cavity 14 may also be formed with a restricted depth.

As shown in FIG. 3, a via hole is formed on a substrate 21 having a thickness over 300 μm, a seed layer 23 is formed on one surface of the substrate 21, and a metal 22 is filled by back contact plating. Since the seed layer 23 is not formed on the inner circumference of the via hole, a fine plating layer is not obtained. That is, in the case where the via hole is plated without the seed layer, alien substances may be trapped on the interface between the silicon (Si) material and the plating material. Therefore, the interface between the Si material and the plating material is weakened to cause defects.

As a result, the aforementioned methods cannot efficiently plate the via hole having the seed layer in the Si wafer which has a thickness over 200 μm and includes a cavity as required in packaging. Moreover, the above methods cannot efficiently perform the processes, including creating the cavity, and thus are not suitable to manufacture a cap for a semiconductor device package.

SUMMARY OF THE INVENTION

The present invention provides a cap for a semiconductor device package which can form a cavity and plate a via hole having a seed layer, and a manufacturing method thereof.

The present invention also provides a cap for a semiconductor device package which can plate a via hole having a seed layer in a wafer having a thickness over 200 μm, and a manufacturing method thereof.

According to an aspect of the invention, there is provided a cap for a semiconductor device package, comprising a body formed at a predetermined thickness with a cavity; a first seed layer formed on an inner circumference of a first via hole formed at a predetermined depth from the cavity formation surface of the body; a second seed layer formed on an inner circumference of a second via hole formed at a predetermined depth from the opposite surface to the cavity formation surface of the body; and plating materials filled in the first via hole and the second via hole.

In an exemplary embodiment, the body is an Si wafer.

Further, the body may have a thickness of at least 300 μm, and the first via hole may have a depth of at least 100 μm.

According to another aspect of the invention, there is provided a manufacturing method of a cap for a semiconductor device package, comprising: forming a cavity on one side surface of an Si wafer; forming a first via hole on one side surface of the Si wafer at a predetermined depth, and forming a first seed layer on the whole surface including the inner circumference of the first via hole; plating a metal in the first via hole; forming a second via hole on the other side surface of the Si wafer at a predetermined depth, and forming a second seed layer on the whole surface including the inner circumference of the second via hole; and plating a metal in the second via hole.

In an exemplary embodiment, the first and second via holes are formed by an Inductively Coupled Plasma Reactive Ion Etching (ICP RIE) process.

Further, the first via hole may be plated by a damascene electroplating process and the second via hole may be plated by a back contact electroplating process.

In yet another exemplary embodiment, the first and second seed layers may be formed by sputtering Cr/Au or Ti/Cu material.

Also, the manufacturing method of the cap for the semiconductor device package may further comprise removing the seed layer after plating the second via hole. This may be carried out by a chemical mechanical polishing (CMP) process.

BRIEF DESCRIPTION OF THE DRAWINGS

The above aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

A cap for a semiconductor device package and a manufacturing method thereof in accordance with the present invention will now be described in detail with reference to the accompanying drawings. Well-known functions or constructions are not described in detail since they would obscure the invention in unnecessary detail.

Figure 1:
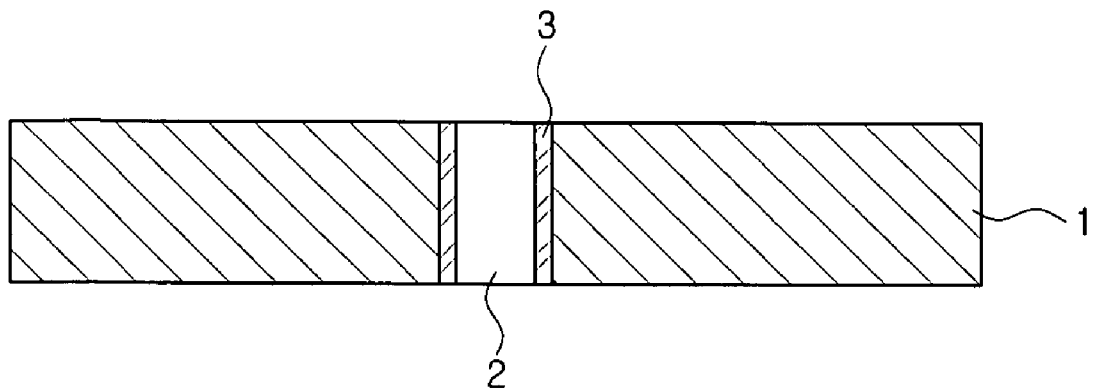
FIGS. 1 to 3 are cross-sectional views illustrating various methods for plating a via hole of a substrate to manufacture a related art cap for a semiconductor device package.
Figure 2:
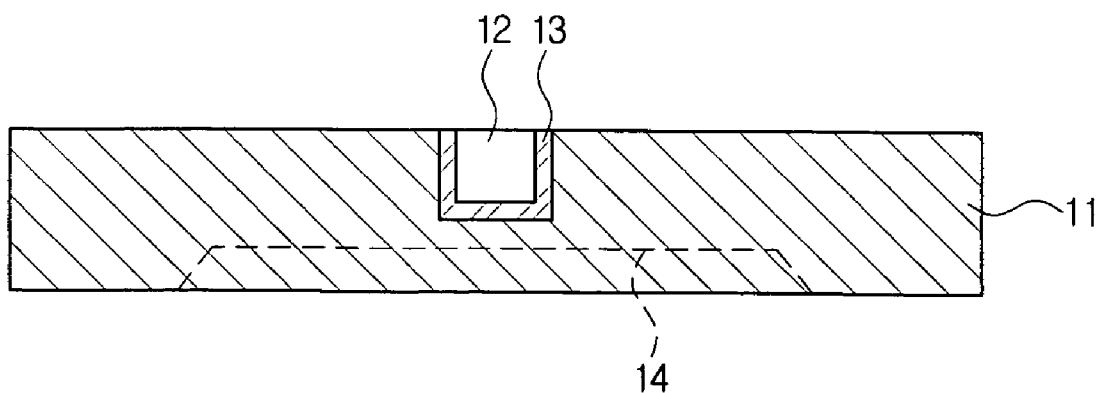
Figure 3:
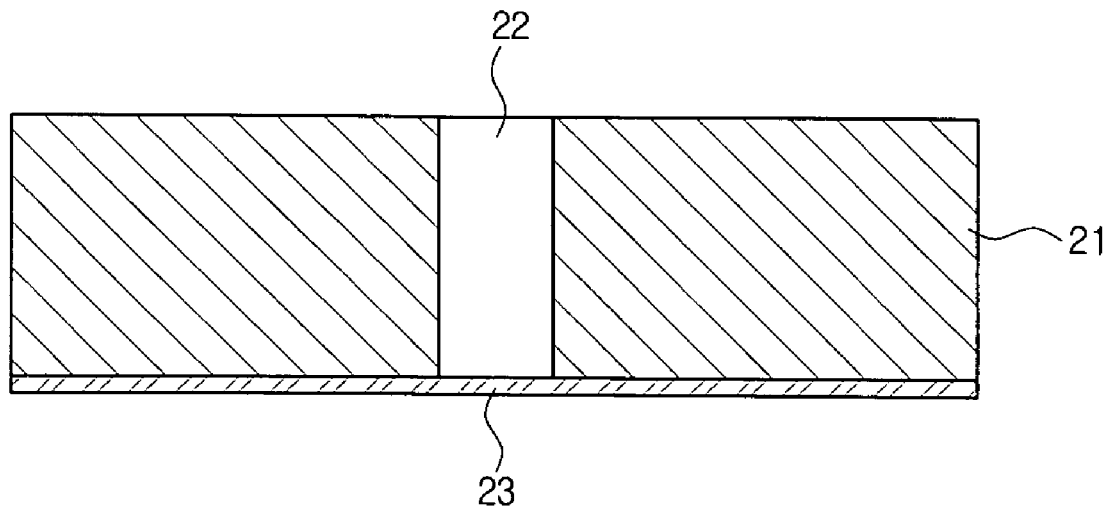
Figure 4:
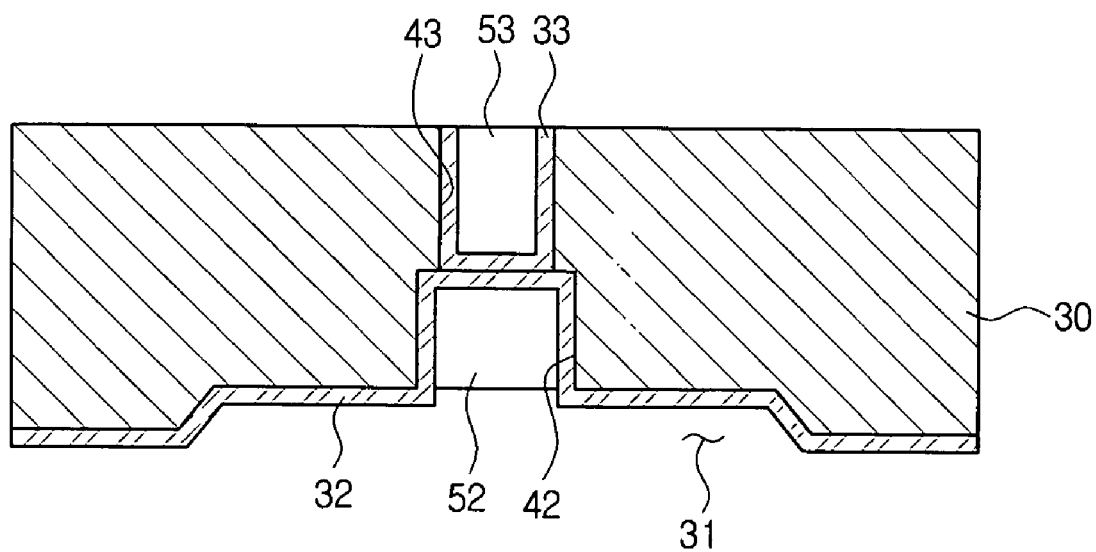
FIG. 4 is a cross-sectional view illustrating a cap for a semiconductor device package in accordance with an exemplary embodiment of the present invention.

Referring to FIG. 4, a cap for the semiconductor device package includes a body 30 made of an Si wafer at a predetermined thickness. Here, the thickness of the body 30 is not limited. In accordance with an exemplary embodiment of the present invention, the body 30 has a thickness of at least 300 µm.

A cavity 31 is formed on one side surface of the body 30. A via hole plating unit having seed layers 32 and 33 is formed in the body 30. The seed layers 32 and 33 are a first seed layer 32 formed on an inner circumference of a first via hole 42 and a second seed layer 33 formed on an inner circumference of a second via hole 43. Plating materials 52 and 53 are filled in the first and second via holes 42 and 43, respectively by a plating process.

That is, the present invention can form the cavity 31 on the Si wafer having a thickness over 200 µm, and plate the via holes 42 and 43 having the seed layers 32 and 33.

In the cap structure, when the body 30 has a thickness of about 300 µm, the first via hole 42 has a depth of about 100 µm, which is not intended to be limiting. In the case that the first via hole 42 is plated by a damascene electroplating process and the second via hole 43 is plated by a back contact electroplating process, the above values are advantageous.

The manufacturing method of the cap for the semiconductor device package in accordance with the present invention will now be described with reference to FIGS. 5A to 5G.

Figure 5A:
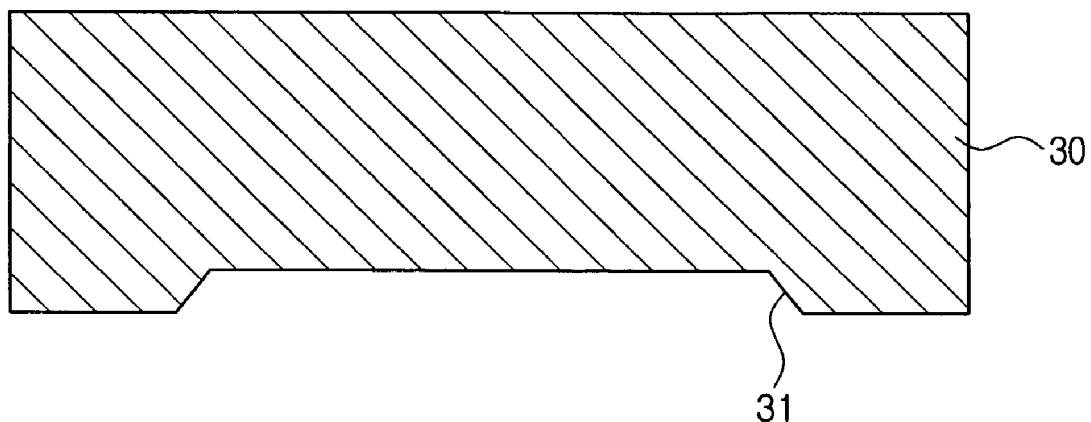
FIGS. 5A to 5G are process views illustrating a manufacturing method of a cap for a semiconductor device package in accordance with an exemplary embodiment of the present invention.

FIG. 5A shows the body 30 made of the Si wafer. The cavity 31 is formed on one side surface of the body 30. The depth and size of the cavity 31 can be adjusted by the ICP RIE process.

Figure 5B:
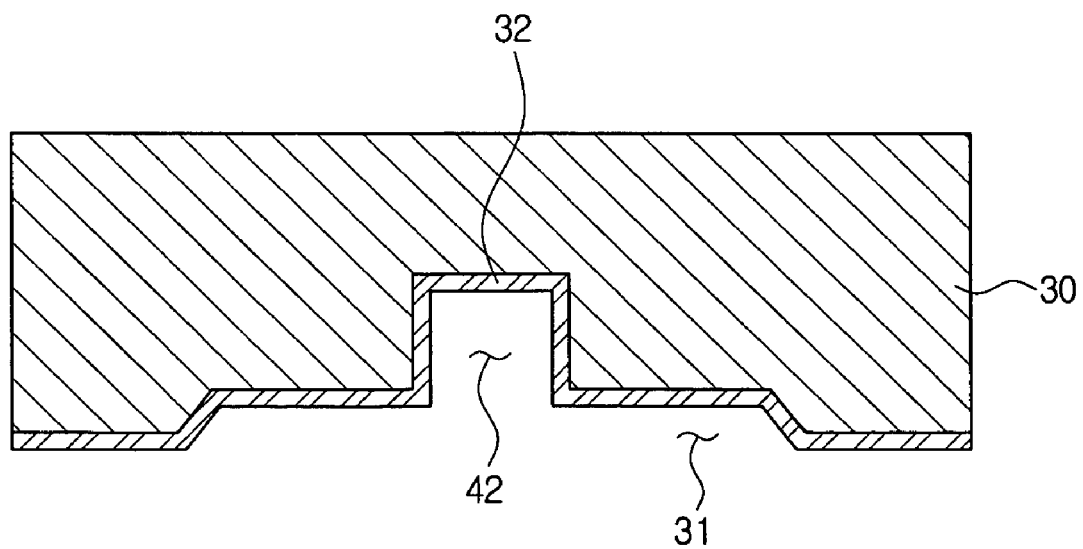

As illustrated in FIG. 5B, the first via hole 42 is formed on one side surface of the body 30, namely, the cavity-formed surface at a predetermined depth. The first seed layer 32 is formed on the whole surface including the inner circumference of the first via hole 42. The first via hole 42 can be formed by the ICP RIE process. The first seed layer 32 can be formed at a desired thickness by sputtering Cr/Au or Ti/Cu. Here, the material or formation method of the first seed layer 32 is not limited to the above example.

Figure 5C:
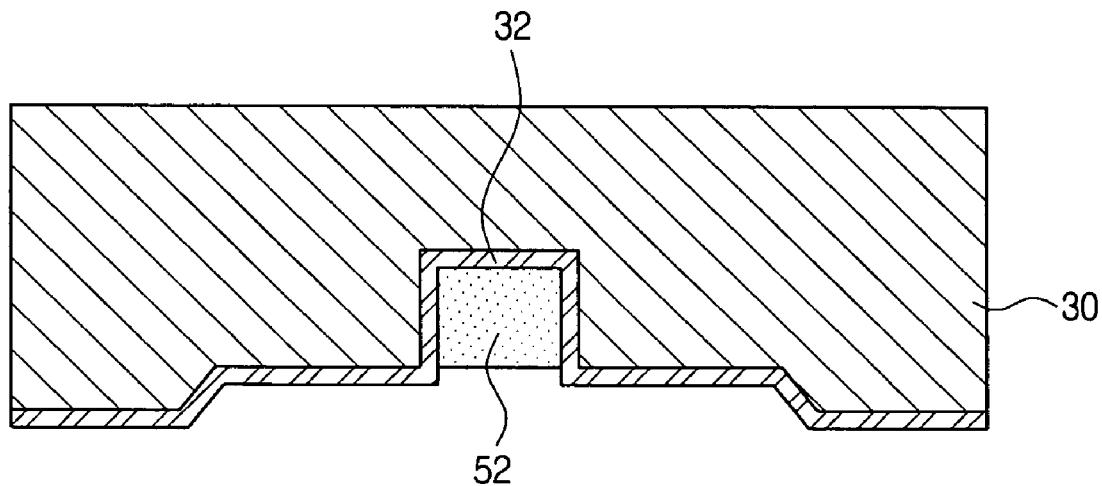

As depicted in FIG. 5C, plating material 52 is filled in the first via hole 42 on which the first seed layer 32 has been formed by plating a metal. The first via hole 42 is plated by the damascene electroplating process suitable for a depth of about 100 µm.

Figure 5D:
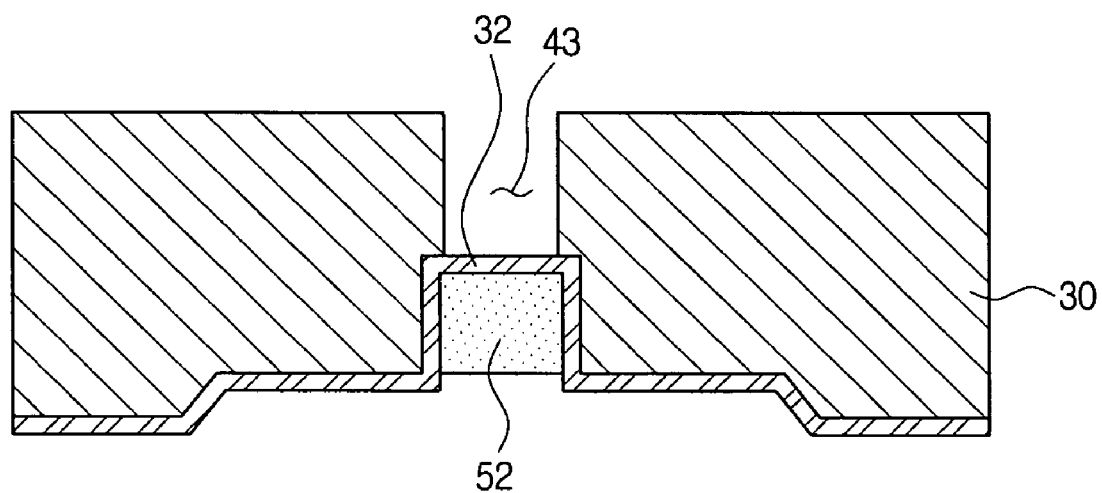

As shown in FIG. 5D, a second via hole 43 is formed on the other side surface of the body 30 at a predetermined thickness. The second via hole 43 is formed to expose the first seed layer 32. Here, the second via hole 43 is formed in the same manner as the first via hole 42.

Figure 5E:
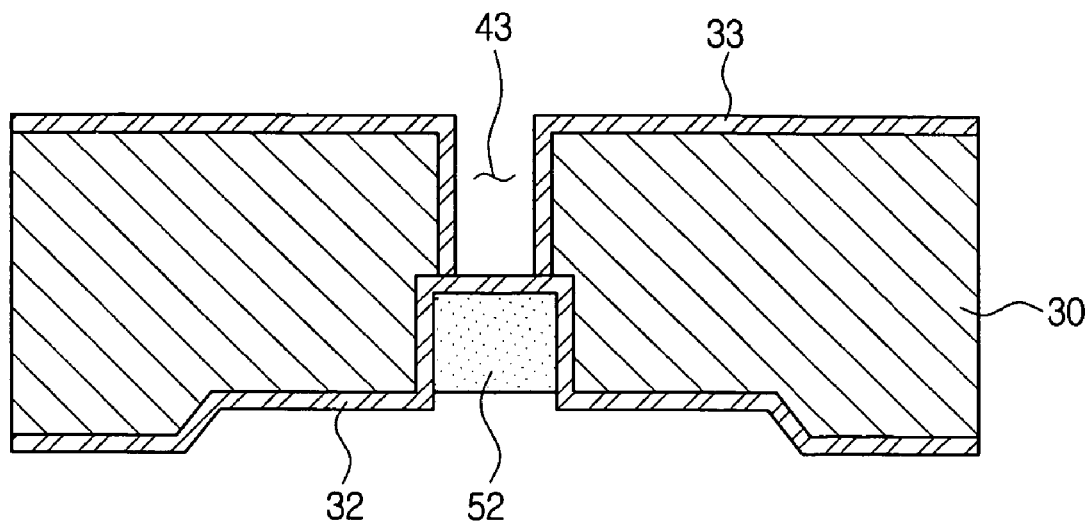

Referring to FIG. 5E, the second seed layer 33 is formed on the whole surface including the inner circumference of the second via hole 43 in the same manner as the first seed layer 32.

Figure 5F:
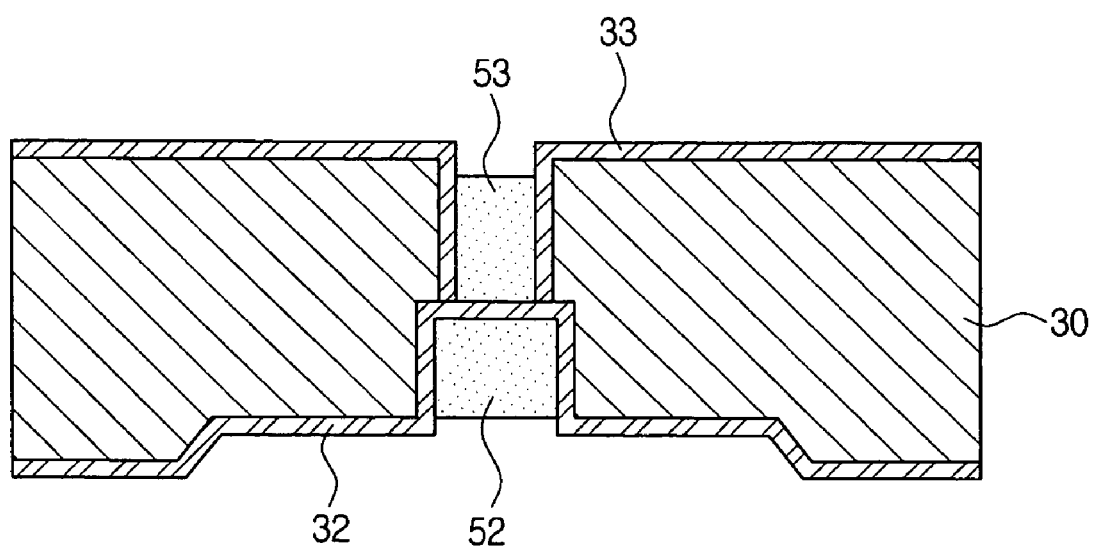

As illustrated in FIG. 5F, the plating material 53 is filled in the second via hole 43 on which the second seed layer 33 has been formed by plating a metal. Since the second seed layer 33 exists on the outer circumference of the second via hole 43 and the first seed layer 32 exists on the bottom surface thereof, a fine plating layer can be obtained by the back contact electroplating process.

Figure 5G:
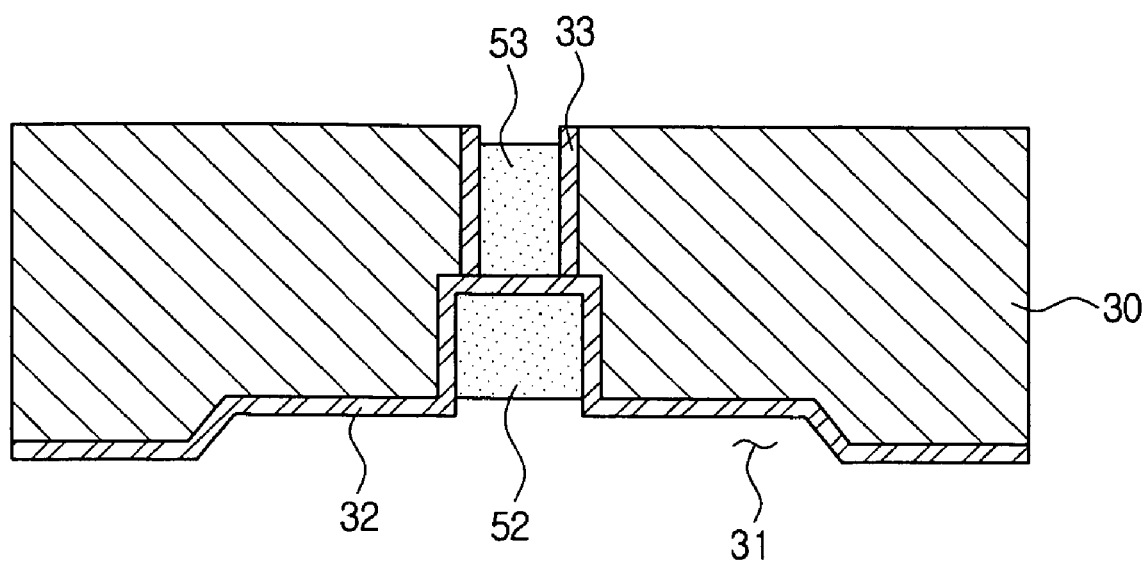

As shown in FIG. 5G, portions of the second seed layer 33 may be removed by a CMP process.

As a result, the present invention can easily embody the electroplating structure having the cavity and the seed layers, namely, the structure suitable for the cap for the semiconductor device package.

As discussed earlier, in accordance with the present invention, it is possible to plate the via holes having the seed layers. Therefore, alien substance traps are not formed on the interface between the Si material used for the wafer and the plating material. This firm and solid interface improves reliability of the package.

The foregoing exemplary embodiments are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A manufacturing method of a cap for a semiconductor device package, comprising:
    forming a cavity on one side surface of a body;
    forming a first via hole on the one side surface of the body at a predetermined depth, and forming a first seed layer on the one side surface including the inner circumference of the first via hole;
    plating a metal in the first via hole;
    forming a second via hole on the a side surface opposing the one side surface of the body at a predetermined depth, and forming a second seed layer on the opposing side surface including the inner circumference of the second via hole; and
    plating a metal in the second via hole,
    wherein the first and the second via holes are separated from each other by at least one of portions of the first and the second seed layers formed on the bottom of the inner circumferences of the first and second via holes.

2. The manufacturing method of the cap for the semiconductor device package as claimed in claim 1, wherein the first and second via holes are formed an ICP RIE process.

3. The manufacturing method of the cap for the semiconductor device package as claimed in claim 1, wherein the plating of a metal in the first via hole uses a damascene electroplating process and the plating of a metal in the second via hole uses a back contact electroplating process.

4. The manufacturing method of the cap for the semiconductor device package as claimed in claim 1, wherein the first and second seed layers are formed by sputtering at least one of Cr/Au and Ti/Cu.

5. The manufacturing method of the cap for the semiconductor device package as claimed in claim 1, further comprising removing the second seed layer after plating the second via hole.

6. The manufacturing method of the cap for the semiconductor device package as claimed in claim 5, wherein the seed layer is removed by a CMP process.

7. The manufacturing method of the cap for the semiconductor device package as claimed in claim 1, wherein the body is an Si wafer.

8. A cap for a semiconductor device package, comprising:
    a body formed at a predetermined thickness, the body including a cavity;
    a first via hole formed at a predetermined depth from a cavity formation surface of the body;
    a first seed layer formed on an inner circumference of the first via hole;

a second via hole formed at a predetermined depth from the opposite surface to the cavity formation surface of the body;

a second seed layer formed on an inner circumference of the second via hole; and one or more plating materials filling the first via hole and the second via hole, wherein the first and the second via holes are separated from each other by at least one of portions of the first and the second seed layers formed on the bottom of the inner circumferences of the first and second via holes.

9. The cap for the semiconductor device package as claimed in claim 8, wherein the body is an Si wafer.

10. The cap for the semiconductor device package as claimed in claim 8, wherein the body has a thickness of at least 300 μm, and the first via hole has a depth of at least 100 μm.

* * * * *